(12) United States Patent
Song et al.

(10) Patent No.: US 10,043,859 B2
(45) Date of Patent: Aug. 7, 2018

(54) SUBSTRATE ASSEMBLY AND MANUFACTURING METHOD THEREOF AND DISPLAY DEVICE

(71) Applicant: BOE TECHNOLOGY GROUP CO., LTD., Beijing (CN)

(72) Inventors: Yingying Song, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/107,876

(22) PCT Filed: Jan. 13, 2016

(86) PCT No.: PCT/CN2016/070776
§ 371 (c)(1),
(2) Date: Jun. 23, 2016

(87) PCT Pub. No.: WO2017/020556
PCT Pub. Date: Feb. 9, 2017

(65) Prior Publication Data
US 2017/0213878 A1 Jul. 27, 2017

(30) Foreign Application Priority Data
Jul. 31, 2015 (CN) .......................... 2015 1 0461859

(51) Int. Cl.
*H01L 29/08* (2006.01)
*H01L 21/00* (2006.01)
(Continued)

(52) U.S. Cl.
CPC ...... *H01L 27/3246* (2013.01); *H01L 25/0655* (2013.01); *H01L 27/3258* (2013.01);
(Continued)

(58) Field of Classification Search
CPC ............ H01L 51/0005; H01L 51/5012; H01L 27/3262; H01L 29/786; H01L 25/0655;
(Continued)

(56) References Cited

U.S. PATENT DOCUMENTS 8,816,339 B2 * 8/2014 Kawamura ......... H01L 27/3246
257/40
2006/0097263 A1 * 5/2006 Lee ..................... H01L 27/3246
257/72

(Continued)

FOREIGN PATENT DOCUMENTS

CN 1773716 A 5/2006
CN 101796561 A 8/2010
(Continued)

OTHER PUBLICATIONS

International Search Report and Written Opinion of the ISA in PCT/CN2016/070776, with English translation. 15 pages.
(Continued)

*Primary Examiner* — Alonzo Chambliss
(74) *Attorney, Agent, or Firm* — Womble Bond Dickinson (US) LLP

(57) ABSTRACT

The present invention provides a substrate assembly comprising: a substrate; electrodes, metal wirings and TFTs formed on the substrate; and banks formed over the substrate, the banks enclosing pixel areas and exposing the electrodes; wherein a surface of the bank away from the substrate comprises one or more grooves, the grooves being adapted for collecting ink droplets remaining on the bank during subsequent inkjet printing process. The present invention further relates to a method for manufacturing a substrate assembly and a display device.

13 Claims, 3 Drawing Sheets

(51) Int. Cl.
   *H01L 27/32* (2006.01)
   *H01L 25/065* (2006.01)
   *H01L 29/786* (2006.01)
   *H01L 51/00* (2006.01)
   *H01L 51/50* (2006.01)
   *H01L 51/56* (2006.01)

(52) U.S. Cl.
   CPC ...... *H01L 27/3262* (2013.01); *H01L 27/3276* (2013.01); *H01L 29/786* (2013.01); *H01L 51/0005* (2013.01); *H01L 51/5012* (2013.01); *H01L 51/56* (2013.01); *H01L 2227/323* (2013.01); *H05K 999/99* (2013.01)

(58) Field of Classification Search
   CPC ............. H01L 27/3258; H01L 27/3246; H01L 27/3276
   See application file for complete search history.

(56) References Cited

U.S. PATENT DOCUMENTS

| | | | | |
|---|---|---|---|---|
| 2009/0256474 | A1* | 10/2009 | Wang | H01L 51/0003 313/504 |
| 2010/0291723 | A1 | 11/2010 | Low et al. | |
| 2013/0277649 | A1* | 10/2013 | Gregory | H01L 27/3246 257/40 |
| 2016/0043151 | A1* | 2/2016 | Kato | H01L 27/3246 257/40 |

FOREIGN PATENT DOCUMENTS

| | | |
|---|---|---|
| CN | 102150476 A | 8/2011 |
| CN | 101849281 A | 9/2013 |
| CN | 103367391 A | 10/2013 |
| CN | 104698662 A | 6/2015 |
| CN | 105140236 A | 12/2015 |
| JP | 2004111166 A | 4/2004 |

OTHER PUBLICATIONS

Office Action in Chinese Application No. 201510461859.7 dated Aug. 2, 2017, with English translation.

Office Action received for Chinese Patent Application No. 201510461859.7, dated Jan. 29, 2018, 15 pages (8 pages of English Translation and 7 pages of Office Action).

International Preliminary Report on Patentability received for PCT Patent Application No. PCT/CN2016/070776, dated Feb. 15, 2018, 14 pages (9 pages of English Translation and 5 pages of Original Document).

* cited by examiner

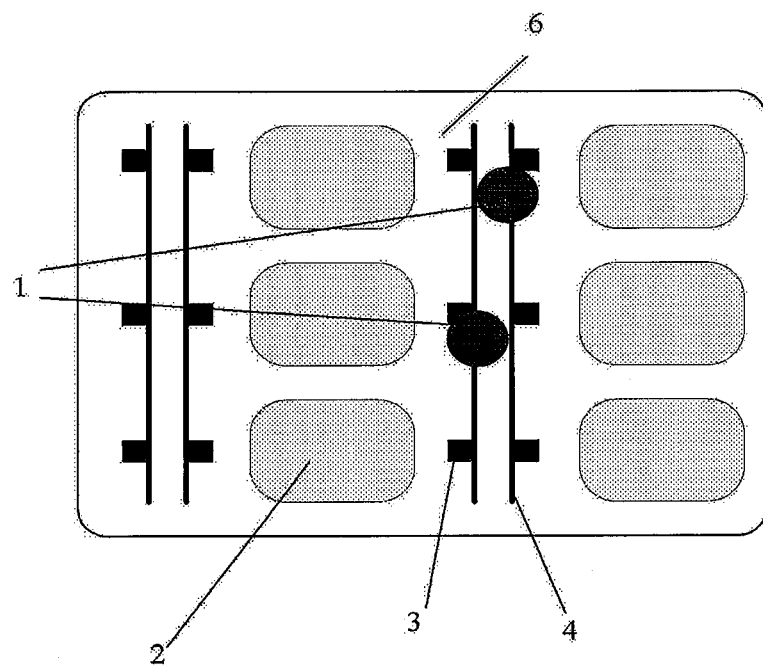
Fig.1    - - Prior Art - -
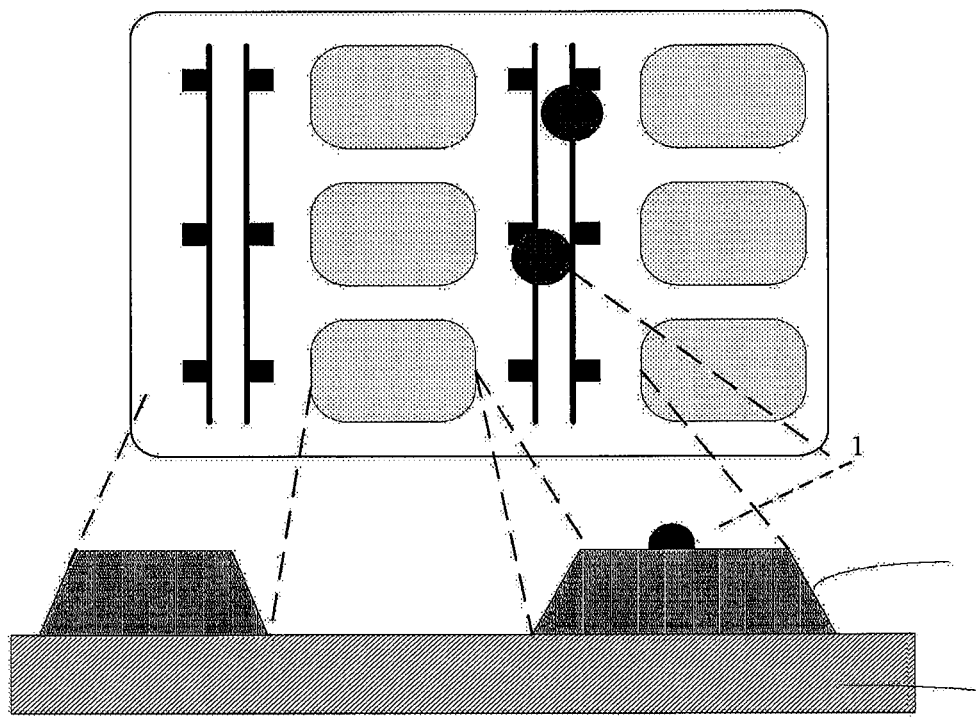
Fig.2    - - Prior Art - -

SUBSTRATE ASSEMBLY AND MANUFACTURING METHOD THEREOF AND DISPLAY DEVICE

TECHNICAL FIELD

The present invention relates to the technical field of the manufacture of OLEDs, and particularly to a substrate assembly adapted for OLEDs and a manufacturing method thereof.

BACKGROUND

The organic light-emitting diode (OLED, or called organic electroluminescence) technology is always considered as one of the most competitive luminescence and display technologies in the next century. However, in the aspect of application of the display, the OLED display seems to have been seriously challenged in terms of enlargement and productivity since commercialization of the PLOED display published by Pioneer in 1996. Serious challenges mainly come from two aspects, one is the TFT backboard of an active matrix, and the other is the manufacture procedure and encapsulation issue of the organic material. The manufacture procedure of the organic material mainly includes an evaporation plating procedure and a solution manufacture procedure. For the enlarged substrate, the vacuum thermal evaporation plating technology is confronted with great defects, for example, the light-shielding plate is easily affected by the high-temperature environment in the process flow so as to shift, causing that it is difficult to maintain a uniform deposition rate on the substrate. The solution manufacture procedure employs the inkjet printing technology. Therein, the inkjet printing technology enables the formation of a thin film layer by homogeneously depositing the liquid organic material. Therefore, such technology can theoretically better solve the large-size problem.

The inkjet printing is classified into continuous printing and non-continuous printing. The continuous printing mode belongs to a mask-free, contactless manufacture procedure, which has the advantages of performing successive printing, continuously and stably spraying ink due to the larger bore without blocking the nozzle, having high yield, and facilitating enlargement while having a large degree of freedom of the ink composition. However, during the process of continuous printing, it is required to spray ink to several rows of pixels during one printing cycle, and spray ink to other several rows of pixels during the next printing cycle. Successive printing is performed by cycling and repeating the above steps to realize spraying of the whole substrate.

Moreover, during the continuous printing, ink droplets would also drip on the bank between pixels. However, the conventional bank of the prior art would involve the phenomenon of unevenness in the metal wiring and TFT areas, leaving ink droplets in the areas and consequently changing the surface hydrophobic property of the areas. When other film layers are further printed subsequently, more ink is likely to remain, so that further affects the homogeneity of ink within pixels or causes a cross-color phenomenon between adjacent pixels.

Therefore, there is a demand for an improved technology to solve the above problems in the prior art.

SUMMARY

In order to solve the above technical problems, the present invention provides a substrate assembly and a method for manufacturing it.

In accordance with an aspect, a substrate assembly is provided, which comprises: a substrate; electrodes, metal wirings and TFTs on the substrate; and banks over the substrate, the banks enclosing pixel areas and exposing the electrodes; wherein a surface of the bank away from the substrate comprises one or more grooves, the grooves being adapted for collecting ink droplets remaining on the bank during subsequent inkjet printing process.

According to preferred embodiments, the substrate assembly is adapted for manufacturing an OLED display panel by means of continuous inkjet printing process.

According to preferred embodiments, the bank is made of hydrophobic material.

According to preferred embodiments, an insulating protective layer is further provided between the bank and the layer of the metal wiring and TFT.

According to preferred embodiments, the groove is located on a bank having a size larger than or equal to 100 μm in a row or column direction of the substrate.

According to preferred embodiments, the groove is of a frustum structure, and an opening of the groove at the surface of the bank has a diameter of 20-100 μm.

According to preferred embodiments, the horizontal dimension of the groove at the surface of the bank has a minimum size of at least 20 μm.

According to preferred embodiments, the groove is located on a bank corresponding to the TFT and the metal wiring.

In accordance with another aspect, a manufacturing method of a substrate assembly is provided, which comprises: forming metal wirings, TFTs and electrodes on a substrate; forming banks over the substrate, the banks enclosing pixel areas and exposing the electrodes; forming one or more grooves on a surface of the bank away from the substrate, wherein the grooves are used for collecting ink droplets remaining on the bank during subsequent inkjet printing process.

According to preferred embodiments, the groove is manufactured using a mask with adjustable exposure.

According to preferred embodiments, the bank is formed by coating and mask exposure and development processes, and the groove is formed by exposure and development using the same mask used for forming the bank by exposure and development.

According to preferred embodiments, the groove is formed on a bank having a size larger than or equal to 100 μm in a row or column direction of the substrate.

In order to manufacture a complete display panel, the method further comprises steps of continuously spraying an organic luminescent material solution on the substrate and performing drying processing, and further comprises steps of forming another electrode and performing encapsulation.

In accordance with another aspect, a display device is provided, which comprises the substrate assembly stated above.

The beneficial effects of the present invention are: manufacturing grooves on the banks at the pixel TFT and metal wiring areas such that the ink dripping into these areas during the continuous printing process is all collected in the grooves, thereby solving the problem in the conventional bank design that the ink residues on the back causes change in the surface hydrophobic property, which further cause more ink to remain during subsequent printing or further affect the homogeneity of ink within pixels or cause a cross-color phenomenon between pixels, etc. Furthermore, the manufacture of the groove does not need additionally adding a mask or a procedure, and is simple and easy to achieve.

BRIEF DESCRIPTION OF THE DRAWINGS

The drawings are included to provide further understanding of embodiments and the drawings are incorporated into the present specification and constitute a part thereof. The drawings illustrate the embodiments and are used for explaining the principle of the embodiments together with the description. It would be easy to recognize other embodiments and many expected advantages of the embodiments for they can be well understood by reference to the detailed description below. The elements of the drawings are not necessarily drawn to scale. The same reference sign denotes corresponding similar components.

FIG. 1 illustrates a schematic diagram of a substrate assembly in the prior art.

FIG. 2 shows a schematic diagram of the substrate assembly in the prior art in a side sectional view.

DETAILED DESCRIPTION OF THE INVENTION

Figure 3:
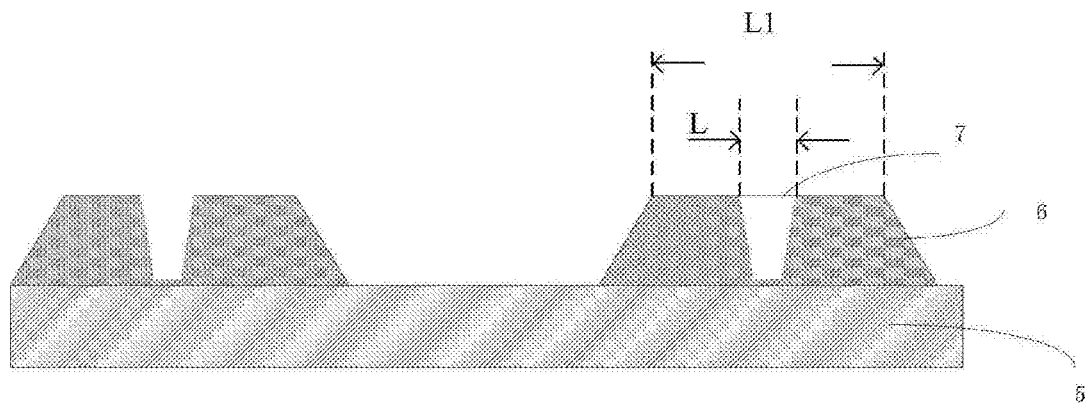
FIG. 3 shows a schematic diagram of a substrate assembly according to an embodiment of the present invention.

The detailed description below makes reference to the drawings, which form a part of the detailed description and are shown by specific illustrative embodiments in which the present invention can be implemented. In this regard, directional terms are used with reference to the orientations of the described drawings, for example, "top", "bottom", "left", "right", "upper", "lower", and the like. Since the components in the embodiments may be positioned in several different orientations, the directional terms are used for illustrative purpose and the directional terms are by no means limiting. It should be understood that other embodiments can be utilized or logical modifications can be made without departing from the scope of the present invention. Therefore, the detailed description below should not be used in the sense of limitation, and the scope of the present invention is defined by the claims enclosed.

Furthermore, the expression "on" used for describing a part, element or material layer that is formed or positioned "on" a surface can be used herein to indicate that said part, element or material layer is "directly" positioned (e.g. placed, formed, deposited, etc) on the implied surface, e.g. in direct contact therewith. The expression "over" used for describing a part, element or material layer that is formed or positioned "over" a surface can be used herein to indicate that said part, element or material layer is "indirectly" positioned (e.g. placed, formed, deposited, etc) on the implied surface, with one or more additional parts, elements or layers arranged between the implied surface and said part, element or material layer.

It should be understood that the features of respective illustrative embodiments as described herein can be combined with each other, unless particularly indicated otherwise.

FIG. 1 illustrates a schematic diagram of the prior art substrate assembly. The substrate assembly may be used for manufacturing an OLED light-emitting device. FIG. 1 shows several illustrative pixel areas located on the substrate and peripheral elements thereof. It can be seen from FIG. 1 that the prior art substrate assembly comprises pixel areas 2, TFTs 3 and metal wirings 4 formed on a substrate. There are electrodes at the respective quasi-rectangular pixel areas 2, which are generally anode electrodes (which will be sprayed with organic luminescent material in subsequent processes). The electrodes are usually made of hydrophilic conductive material such as indium tin oxide (ITO), or made of metal. The boundary region surrounding the pixel areas 2 has a thin film transistor (TFT) 3 and metal wiring 4 as well as other essential components. However, it is well-known to those skilled in the art that an insulating protective layer and a planarization film are generally also formed on the TFT 3 and the metal wiring 4. The description of these conventional parts is omitted in the present application. It is to be noted that the shape of the pixel area is not limited to the shape as shown in the drawings, and may be any suitable shape such as circle, ellipse, and so on. The above components are all components well known by those skilled in the art, and the methods for manufacturing them are also processes well known in the art. Thus the description of the specific methods for manufacturing them is omitted here.

Furthermore, a bank 6 made of hydrophobic material is formed on the boundary region, though it is not shown in FIG. 1, which may also be called bank-like object, isolating wall or coffer, etc. The bank is used for enclosing the pixel area to form a well 2. The well 2 facilitates the ink droplets to aggregate in the well 2 during the subsequent inkjet printing process. FIG. 2 shows a schematic diagram of a part of the prior art substrate assembly in a side-sectional view, wherein the side-sectional views of the bank 6 and the substrate 5 are shown in contrast with the top view shown in FIG. 1. The bank 6 may be formed by first depositing or coating a layer of hydrophobic material on the substrate and then performing mask exposure and development. The hydrophobic material used for the bank 6 may be an organic fluorine-containing polymer or other suitable materials. In normal cases, the surface of the bank 6 is hydrophobic, and consequently the ink droplets would not remain on the bank 6 during the subsequent inkjet printing process but aggregate in the well 2, i.e. on the electrode. However, the conventional bank would involve the phenomenon of unevenness in some areas, that is, after one inkjet printing, some ink droplets (as exemplarily shown by the reference sign 1 in FIG. 2) are likely to remain on the bank 6. However, the residual ink droplets 1 would influence the hydrophobic property of the bank surface. As a result, the residual ink droplets 1 would attract more ink droplet residues during the next-time inkjet printing process (the continuous printing process requires successive printing), and further influence the distribution of printing ink on the substrate, even cause cross color between pixels of different colors. This affects the luminescent effect of the display panel.

Figure 4:
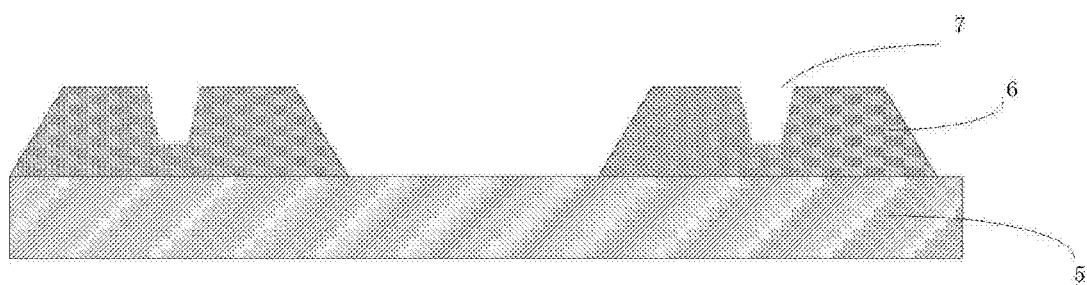
FIG. 4 shows a schematic diagram of a substrate assembly according to another embodiment of the present invention.
Figure 5:
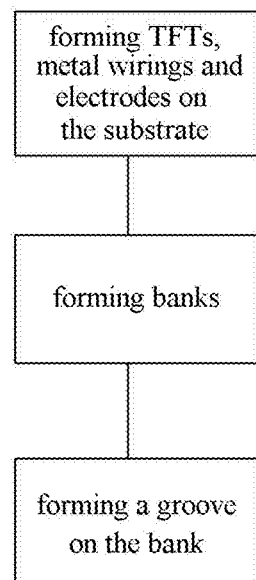
FIG. 5 shows a method for manufacturing a substrate assembly according to embodiments of the present invention.

Embodiments of the present invention are described below with reference to FIGS. 3-5.

FIG. 3 shows a schematic diagram of a substrate assembly according to an embodiment of the present invention. It can be seen from FIG. 3 that a groove 7 with a certain depth is formed in the bank 6. The groove 7 can be used for collecting the ink droplets remaining on the surface of the bank 6 during the inkjet printing process, thereby not influencing the subsequent further inkjet printing and maintaining the hydrophobic property of the surface of the bank 6. Preferably, the groove is located in the middle of the bank 6. Moreover, since the ink droplets do not easily remain on a bank with a width less than 100 μm, the groove 7 is preferably formed on a bank with a size larger than or equal to 100 μm in the row or column direction of the substrate. In this manner, when the inkjet printing path passes through over the bank, the groove 7 on the bank can collect possible ink droplet residues. It is to be noted that the size in the row or column direction of the substrate is directed at the portion between two pixel areas 2 (see FIG. 2). In an implementation, the row direction of the substrate is also the direction of continuous inkjet printing in the inkjet printing process. In this way, in the course of inkjet printing, the ink droplets are easier to be collected by the groove on the bank. In preferred embodiments, the horizontal dimension (as denoted by the reference sign L) of the groove 7 at the surface (i.e. upper surface) of the bank away from the substrate has a size of at least 20 μm, preferably 20-100 μm (in the case that the groove 7 has a shape of frustum, the size should be the diameter of the top of the frustum). Certainly, the above size parameters are only exemplary. The respective sizes of the groove can be flexibly determined according to the amount of ink of inkjet printing, as long as the ink droplets on the bank can be collected.

Furthermore, the depth of the groove 7 may substantially reach the bottom of the bank 6 with the proviso that it does not touch the insulating protective layer on the TFT element and the metal wiring on the substrate. In another embodiment of the present invention, the depth of the groove may approximately be a half of the height of the bank, as shown in FIG. 4. Although the drawings show that the shape of the cross section of the groove is an inverted trapezoid, the groove may be manufactured as having a shape such as cube, cylinder, cone or frustum. However, the opening of the groove at the upper surface of the bank may have a shape of ellipse, circle or quasi rectangle. In the present invention any groove shapes that can implement the collection of ink droplets are envisaged. Furthermore, one or more grooves can be formed on a single bank as required, so as to further improve the effect of ink droplet collection.

A method for manufacturing a substrate assembly according to the present invention is described below with reference to FIG. 5. The method comprises providing a substrate in advance. The substrate may be any standard substrate for manufacturing a display panel, which substrate is made of, for example, plastic, glass, etc.

In step 1, elements such as metal wirings, TFTs and electrodes are formed on the substrate. These elements constitute a drive circuit for the OLED luminescent material, thus they are essential elements for manufacturing an OLED light-emitting panel. The processes for forming these elements are not the focus of the present invention, the description of which is thus omitted here.

In step 2, banks made of hydrophobic material are formed on the substrate, and the banks enclose pixel areas and expose the electrodes. The bank may be formed by deposition and mask exposure processes, or by shadow mask process. However, in an undesired case, the surface of the bank may involve the phenomenon of unevenness.

In step 3, one or more grooves are formed on the upper surface of the bank. The groove is used for collecting the ink droplets remaining on the bank during the inkjet printing process. In terms of its manufacturing method, the groove may be exposed and developed on the bank using an exposure adjustable mask (e.g. half-mask), wherein the depth of the groove may be adjusted using the exposure adjustable mask. According to preferred embodiments, the mask used for exposing the groove may be the same as the one used for forming the bank. As a result, there is no need to additionally add a mask or a procedure. Consequently, compared to the prior art, the substrate assembly according to the present invention can be obtained at very low additional cost.

Certainly, the substrate assembly manufactured by the above steps is not a finished display device. The present embodiment further provides a display device comprising any of the above substrate assemblies. In order to manufacture a finished display device such as organic light-emitting diode (OLED) display, polymer light-emitting diode (PLED) display, and the like, it is further required to perform, for example, inkjet printing of a luminescent material solution to the substrate assembly, subsequently perform drying processing so as to leave a solid light-emitting material layer and form pixels, and then form corresponding essential driving elements such as cathodes on the pixels, perform encapsulation and driving the peripheral circuits. However, the substrate assembly of the present invention is especially suitable for the printing process of continuous printing, i.e. implementing the inkjet process for the whole panel through multiple printing cycles. Finally, there would usually be a step of encapsulating the formed display panel. Those skilled in the art understand that although the above method recites some essential steps, it does not indicate that the method cannot comprise other steps between these steps. On the contrary, there may be other steps and procedures between the respective steps according to needs of the practical product and different processes, for example, there may be a step of forming an insulating protective layer, etc. between step 1 and step 2.

Furthermore, it is to be noted that the improvement points of the present invention mainly lie in the improvement to the bank. However, those skilled in the art can easily conceive combining such improvement into various manufacture processes of the prior art OLED so as to solve the technical problem to be solved by the present invention and achieve the corresponding technical effect. The present invention claims the technical solutions of respective manufacture processes which utilize the above improvement points.

The specific embodiments of the present application are described above, but the protection scope of the present application is not so limited. Any variation or substitution that can be easily conceived by the skilled person familiar with this technical field within the technical scope revealed by the present application shall be covered within the protection scope of the present application. Thus, the protection scope of the present application should be defined by the protection scope of the claims.

In the description of the present application, it is to be understood that the orientations or positional relationships denoted by the terms such as "upper", "lower", "inside" and "outside" are based on the orientations or positional relationships shown in the drawings. The terms are just for facilitating the description of the present application and simplifying the description, rather than indicating or implying that the denoted devices or elements must have specific orientations and must be constructed and operated in specific orientations, thus they cannot be understood as limitation to the present application. Although respective steps are listed in a certain order in the method claim, these steps are not necessarily executed in the listed order, but can be executed in an opposite or parallel order without departing from the spirit and gist of the present invention. The wording "comprise" does not exclude the presence of elements or steps not listed in the claims. The word "a" or "an" preceding an element does not exclude the presence of a plurality of such elements. The simple fact that certain measures are recited in mutually different dependent claims does not indicate that the combination of these measures cannot be used to advantage. Any reference sign in the claims should not be interpreted as limitation to the scope.

The invention claimed is:

1. A substrate assembly comprising:
a substrate;
electrodes, metal wirings and TFTs on the substrate; and
banks over the substrate, the banks enclosing pixel areas and exposing the electrodes;
wherein a surface of the bank away from the substrate comprises at least one groove, the groove being adapted for collecting ink droplets remaining on the bank during subsequent inkjet printing process;
wherein an insulating protective layer is further provided between the bank and the layer of metal wiring and TFT;
wherein the groove is located on the bank having a size larger than or equal to 100 micrometer in a row or column direction of the substrate and
wherein a horizontal dimension of the groove at the surface of the bank has a minimum size of at least 20 μm.

2. The substrate assembly according to claim 1, wherein the substrate assembly is adapted for manufacturing an OLED display panel by means of continuous inkjet printing process.

3. A display device, comprising the substrate assembly according to claim 2.

4. The substrate assembly according to claim 1, wherein the bank is made of hydrophobic material.

5. A display device, comprising the substrate assembly according to claim 4.

6. The substrate assembly according to claim 1, wherein the groove is of a frustum structure, and an opening of the groove at the surface of the bank has a diameter of 20-100 μm.

7. A display device, comprising the substrate assembly according to claim 6.

8. The substrate assembly according to claim 1, wherein the groove is located on a bank corresponding to the TFT and the metal wiring.

9. A display device, comprising the substrate assembly according to claim 1.

10. A manufacturing method of a substrate assembly, comprising:
forming metal wirings, TFTs and electrodes on a substrate;
forming banks over the substrate, the banks enclosing pixel areas and exposing the electrodes;
forming at least one groove on a surface of the bank away from the substrate, wherein the groove is used for collecting ink droplets remaining on the bank during subsequent inkjet printing process;
wherein the method further comprises providing an insulating protective layer between the bank and the layer of metal wiring and TFT;
wherein the groove is located on the bank having a size larger than or equal to 100 micrometer in a row or column direction of the substrate
wherein a horizontal dimension of the groove at the surface of the bank has a minimum size of at least 20 μm.

11. The manufacturing method according to claim 10, wherein the groove is manufactured using a mask with adjustable exposure.

12. The manufacturing method according to claim 10, wherein the bank is formed by coating and mask exposure and development processes, and the groove is formed by exposure and development using the same mask used for forming the bank by exposure and development.

13. The manufacturing method according to claim 10, further comprising steps of continuously spraying an organic luminescent material solution on the electrodes formed on the substrate and performing drying processing.

* * * * *